(12) United States Patent
Kim et al.

(10) Patent No.: US 11,848,070 B2
(45) Date of Patent: Dec. 19, 2023

(54) MEMORY WITH DQS PULSE CONTROL CIRCUITRY, AND ASSOCIATED SYSTEMS, DEVICES, AND METHODS

(71) Applicant: Micron Technology, Inc., Boise, ID (US)

(72) Inventors: Mijo Kim, Boise, ID (US); Scott E. Smith, Plano, TX (US); Si Hong Kim, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/523,312

(22) Filed: Nov. 10, 2021

(65) Prior Publication Data

US 2023/0146544 A1    May 11, 2023

(51) Int. Cl.
G11C 7/10 (2006.01)
G11C 8/18 (2006.01)
G11C 7/20 (2006.01)

(52) U.S. Cl.
CPC ............ *G11C 7/1093* (2013.01); *G11C 7/106* (2013.01); *G11C 7/1066* (2013.01); *G11C 7/1087* (2013.01); *G11C 7/20* (2013.01); *G11C 8/18* (2013.01)

(58) Field of Classification Search
CPC ..................................................... G11C 8/18
USPC ......................................... 365/193, 194, 205
See application file for complete search history.

(56) References Cited

U.S. PATENT DOCUMENTS

| | | | | |
|---|---|---|---|---|
| 5,561,792 A * | 10/1996 | Ganapathy | ................ | G06F 1/08 327/155 |
| 6,504,782 B1 * | 1/2003 | Negishi | .................... | G11C 5/14 365/226 |
| 2003/0026161 A1 * | 2/2003 | Yamaguchi | ....... | G11C 11/40615 365/230.03 |
| 2007/0297255 A1 * | 12/2007 | Arasawa | ................ | G11C 29/56 365/194 |
| 2013/0162308 A1 * | 6/2013 | Sakashita | ............... | H03K 21/00 327/237 |
| 2013/0286764 A1 * | 10/2013 | Lin | .......................... | G11C 8/06 324/615 |
| 2021/0304808 A1 * | 9/2021 | Penney | .................. | G11C 7/106 |
| 2022/0052678 A1 * | 2/2022 | Choi | ..................... | H03L 7/0816 |

* cited by examiner

*Primary Examiner* — Hoai V Ho
(74) *Attorney, Agent, or Firm* — Perkins Coie LLP

(57) ABSTRACT

Memory with DQS pulse control circuitry is disclosed herein. In one embodiment, a memory device comprises a DQS terminal and circuitry operably coupled to the DQS terminal. The DQS terminal is configured to receive an external DQS signal including a first pulse having a first width. In turn, the circuitry is configured to generate a second pulse based at least in part on the first pulse and output an internal DQS signal including the second pulse. The second pulse can have a second width greater than the first width. In some embodiments, the external DQS signal can further include a third pulse having a third width greater than the second width. In such embodiments, the circuitry can be further configured to generate and output a fourth pulse based at least in part on the third pulse that has a fourth width equivalent to the third width.

19 Claims, 7 Drawing Sheets

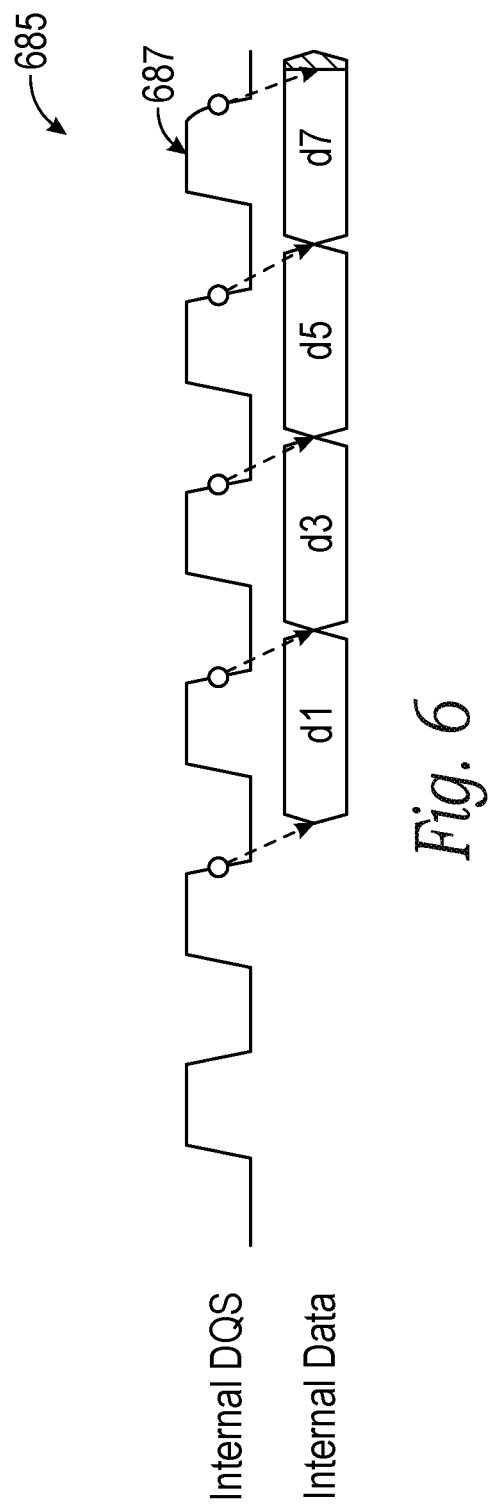

US 11,848,070 B2

MEMORY WITH DQS PULSE CONTROL CIRCUITRY, AND ASSOCIATED SYSTEMS, DEVICES, AND METHODS

TECHNICAL FIELD

The present disclosure is related to memory systems, devices, and methods. In particular, the present disclosure is related to memory with data strobe (DQS) pulse control circuitry, and associated systems, devices, and methods.

BACKGROUND

Memory devices are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and non-volatile memory. Volatile memory, including static random-access memory (SRAM), dynamic random-access memory (DRAM), and synchronous dynamic random-access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR) phase change memory (PCM), ferroelectric random-access memory (FeRAM), resistive random-access memory (RRAM), and magnetic random-access memory (MRAM), among others. Improving memory devices, generally, may include increasing memory cell density, increasing read/write speeds or otherwise reducing operational latency, increasing reliability, increasing data retention, reducing power consumption, or reducing manufacturing costs, among other metrics.

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure. The drawings should not be taken to limit the disclosure to the specific embodiments depicted, but are for explanation and understanding only.

FIG. 6 is a signal diagram of an internal DQS signal and an internal DQ signal in accordance with various embodiments of the present technology.

DETAILED DESCRIPTION

Figure 1A:
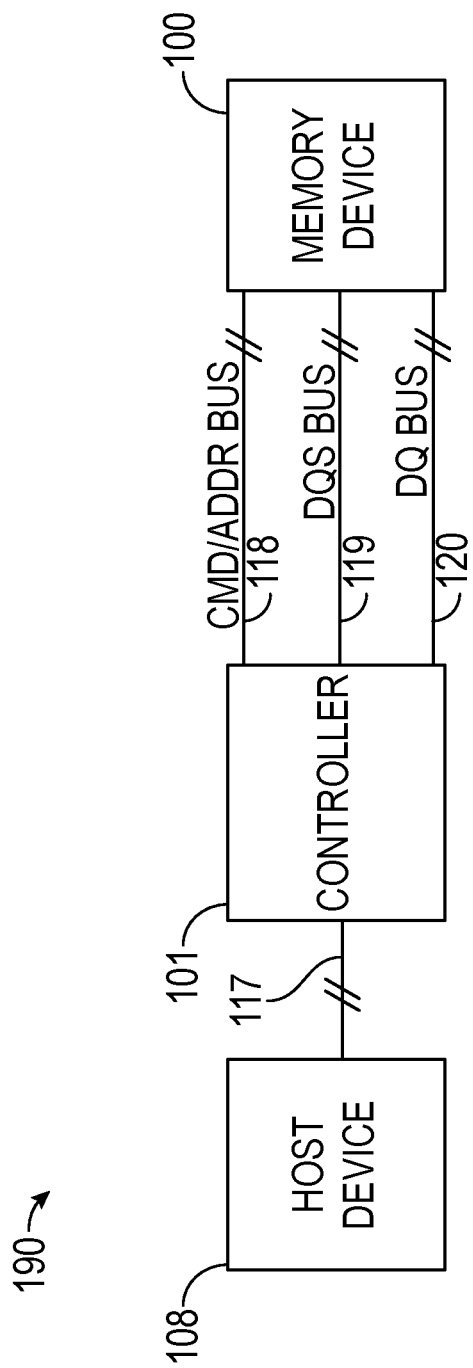
FIG. 1A is a block diagram schematically illustrating a memory system configured in accordance with various embodiments of the present technology.

As discussed in greater detail below, the technology disclosed herein relates to memory with DQS pulse control circuitry, and associated systems, devices, and methods. In some embodiments, a memory device can include circuitry operably coupled to a DQS terminal that is configured to receive an external DQS signal. In operation, the circuitry can be configured to extend the pulse widths of any DQS pulses on the external DQS signal that are less than a minimum pulse width. Thus, the circuitry can ensure that any DQS pulses that are output by the circuitry on an internal DQS signal have widths greater than or equal to a minimum pulse width. A person skilled in the art will understand that the technology may have additional embodiments and that the technology may be practiced without several of the details of the embodiments described below with reference to FIGS. 1A-7.

In the illustrated embodiments below, the memory devices and systems are primarily described in the context of devices incorporating DRAM storage media. Memory devices configured in accordance with other embodiments of the present technology, however, can include other types of memory devices and systems incorporating other types of storage media, including PCM, SRAM, FRAM, RRAM, MRAM, read only memory (ROM), erasable programmable ROM (EPROM), electrically erasable programmable ROM (EEROM), ferroelectric, magnetoresistive, and other storage media, including non-volatile, flash (e.g., NAND and/or NOR) storage media.

A. OVERVIEW

In many memory systems, a memory controller supplies an external DQS signal to a memory device when the memory controller instructs the memory device to write data to its memory array. The memory controller can supply the data to DQ terminals of the memory device, and the external DQS signal can be used as a clock to strobe the data into the memory device via the DQ terminals. In other words, the external DQS signal can be used to instruct the memory device when to sample the data received at the DQ terminals. When the memory device receives the external DQS and DQ signals, the memory device can (a) generate an internal DQS signal based at least in part on the external DQS signal, and (b) latch and register the data received at the DQ terminals at rising and/or falling edges of the internal DQS signal.

At the end of the data transmission (e.g., after a burst of eight data bits), the memory controller can stop transmitting the external DQS signal. More specifically, the memory controller (a) can hold the DQS signal low during a write postamble period for a length of time (e.g., equivalent to half the period (tCK) of the external DQS signal) defined by a DQS write postamble specification tWPST and (b) can then stop driving the external DQS signal. During the write postamble period, the memory device can finish latching and registering the write data received at the DQ terminals. After the memory controller stops driving the external DQS signal, the last rising edge of the external DQS signal can be floated or pulled to a termination voltage.

While the external DQS signal is floated or pulled to a termination voltage, reflections on the corresponding signal traces (e.g., due to parasitics) can cause ringing in the external DQS signal that can be interpreted and registered by the memory device as a transition in the external DQS signal. In other words, the ringing can cause the memory device to register a glitch pulse in an internal DQS signal generated based at least in part on the external DQS signal. In response to the glitch pulse, the memory device can attempt to latch incorrect or invalid data at the DQ terminals, thereby corrupting the last bit of data supplied by the memory controller to the DQ terminals and latched by the memory device. In particular, the last bit of write data can be corrupted by an amount corresponding at least in part to the width of the glitch pulse in the internal DQS signal. Furthermore, a write operation failure can occur when (a) the memory controller does not hold the external DQS signal low during the write postamble period for approximately the length of time defined by the DQS write postamble specification tWPST (e.g., 0.3 tCK or more for a tWPST defined as 0.5 tCK), and (b) ringing in the external DQS signal causes the memory device to register a glitch pulse on the internal DQS signal. Additionally, or alternatively, if the width of the glitch pulse in the internal DQS signal is less than approximately 0.5 tCK, then the memory device may not have enough margin to correctly latch the last bit of data supplied by the memory controller to the DQ terminals of the memory device, causing the write operation to fail.

To address these concerns, memory devices configured in accordance with the present technology can include DQS pulse control circuitry (a) that receives an external DQS signal (or an input based at least in part on the external DQS signal), and (b) outputs an internal DQS signal that includes pulses having widths greater than or equal to a minimum pulse width. In particular, an external DQS signal received by a memory device can be fed into DQS pulse control circuitry. In turn, the DQS pulse control circuitry can extend or stretch any pulses in the external DQS signals that have widths shorter than a minimum pulse width such that the corresponding pulses in the internal DQS signal output from the DQS pulse control circuitry have widths greater than or equal to the minimum pulse width. For example, internal DQS pulses that have pulse widths of approximately 0.3 tCK-0.7 tCK (e.g., 0.5 tCK) are not expected to corrupt internally latched data and/or cause write operation failures in some memory devices because these internal DQS pulses have similar timing margins afforded by DQS pulses during normal write operations. Thus, the minimum pulse width can be set to a value between 0.3 tCK and 0.7 tCK (e.g., 0.5 tCK) in some embodiments. In these embodiments, the DQS pulse control circuitry can stretch any pulses in an external DQS signal having widths less than the minimum pulse width such that corresponding pulses output from the DQS pulse control circuity in the internal DQS signal each have widths equal to the minimum pulse width. Additionally, or alternatively, the DQS pulse control circuitry can be configured such that widths of pulses in the external DQS signal that are greater than or equal to the minimum pulse width pass unhindered or unaltered through the DQS pulse control circuitry. In other words, the DQS pulse control circuitry can ensure that all pulses in an internal DQS signal output from the DQS pulse control circuitry have widths that are greater than or equal to a minimum pulse width. As a result, when the memory device interprets ringing in the external DQS signal as a transition in the external DQS signal, the width of the glitch pulse in the internal DQS signal is extended or stretched by the DQS pulse control circuitry to the minimum pulse width (assuming the width of the glitch pulse is initially less than the minimum pulse width). In turn, the glitch pulse in the internal DQS signal output from the DQS pulse control circuity is less likely to corrupt valid data previously latched by the memory device and/or is less likely to induce write operation failures due to insufficient timing margins. Additionally, or alternatively, when a memory controller does not hold the external DQS signal low during the write postamble period for approximately the length of time defined by the DQS write postamble specification tWPST, the DQS pulse control circuitry can extend the length of time the corresponding portion of the internal DQS signal is held low (e.g., to the minimum pulse width).

B. SELECTED EMBODIMENTS OF MEMORY SYSTEMS AND ASSOCIATED DEVICES AND METHODS

FIG. 1A is a block diagram schematically illustrating a memory system 190 configured in accordance with various embodiments of the present technology. In one embodiment, the memory system 190 is a dual in-line memory module (DIMM) having one or more memory devices 100 (e.g., one or more DRAM memory devices). Although a single memory device 100 is shown in FIG. 1A, the memory system 190 can include one or more modules and/or a plurality of memory devices 100 in some embodiments. Well-known components of the memory system 190 have been omitted from FIG. 1A and are not described in detail below so as to avoid unnecessarily obscuring aspects of the present technology.

The one or more memory devices 100 of the memory system 190 can be connected to an electronic device that is capable of utilizing memory for the temporary or persistent storage of information, or a component thereof. For example, the memory device 100 of FIG. 1A is operably connected to a host device 108. The host device 108 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device 108 may be a networking device (e.g., a switch, a router, etc.); a recorder of digital images, audio, and/or video; a vehicle; an appliance; a toy; or any one of a number of other products. In one embodiment, the host device 108 may be connected directly to the memory device 100 (e.g., via a communications bus of signal traces (not shown)). Additionally, or alternatively, the host device 108 may be indirectly connected to the memory device 100 (e.g., over a networked connection or through intermediary devices, such as through a memory controller 101 and/or via a communications bus 117 of signal traces).

The memory device 100 of the memory system 190 is operably connected to the memory controller 101 via a command/address (CMD/ADDR) bus 118, a data strobe (DQS) bus 119, and a data (DQ) bus 120. As described in greater detail below with respect to FIG. 1B, the CMD/ADDR bus 118, the DQS bus 119, and the DQ bus 120 can be used by the memory controller 101 to communicate commands, memory addresses, and/or data to the memory device 100. In response, the memory device 100 can execute commands received from the memory controller 101. For example, in the event a write command is received from the memory controller 101 over the CMD/ADDR bus 118, the memory device 100 (a) can receive data from the memory controller 101 over the data DQ bus 120 in accordance with a DQS signal received over the DQS bus 119, and (b) can write the data to memory cells corresponding to memory addresses received from the memory controller 101 over the CMD/ADDR bus 118. As another example, in the event a read command is received from the memory controller 101 over the CMD/ADDR bus 118, the memory device 100 can output data to the memory controller 101 over the data DQ bus 120 (a) from memory cells corresponding to memory addresses received from the memory controller 101 over the CMD/ADDR bus 118 and (b) in accordance with a DQS signal transmitted over the DQS bus 119.

Figure 1B:
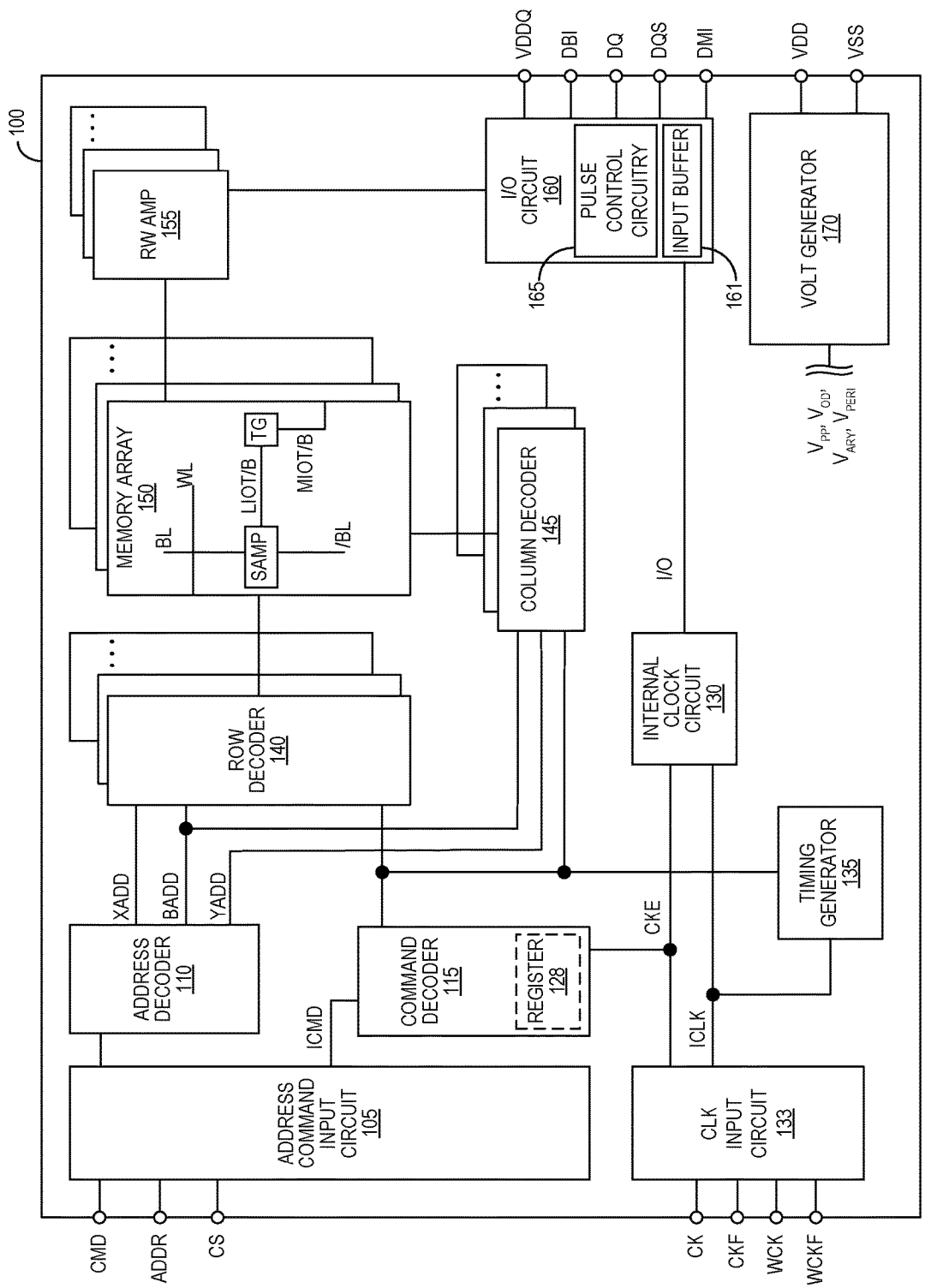
FIG. 1B is a block diagram schematically illustrating a memory device configured in accordance with various embodiments of the present technology.

FIG. 1B is a block diagram of the memory device 100 of FIG. 1A and configured in accordance with various embodiments of the present technology. As shown, the memory device 100 may employ a plurality of external terminals. The external terminals can include command and address terminals operably connected to the CMD/ADDR bus 118 (FIG. 1A) to receive command signals CMD and address signals ADDR, respectively. The external terminals may further include a chip select terminal to receive a chip select signal CS, clock terminals to receive clock signals CK and CKF, data terminals DQ, DQS, DBI, and DMI (e.g., operably connected to the DQS bus 119 and/or to the DQ bus 120 of FIG. 1A), and/or power supply terminals VDD, VSS, and VDDQ. The memory device 100 may additionally or alternatively include data clock terminals to receive data clock signals WCK and WCKF, and/or a read data strobe terminals RDQS. For example, in embodiments in which the memory device 100 is a double data rate (DDR) memory device or a low-power DDR fourth-generation (LPDDR4) memory device, the memory device 100 can include clock terminals CK and CKF to receive a differential clock signal and bidirectional data strobe terminals DQS to transmit and/or receive differential data strobe signals DQS_t and DQS_c. As another example, in embodiments in which the memory device 100 is a graphics DDR (GDDR) or a LPDDR fifth-generation (LPDDR5) memory device, the memory device 100 can include clock terminals CK and CKF to receive data clock signals, data clock terminals to receive data clock signals WCK and WCKF, and a unidirectional read data strobe terminal RDQS (e.g., in lieu of the data strobe DQS terminal).

The power supply terminals of the memory device 100 may be supplied with power supply potentials $V_{DD}$ and $V_{SS}$. These power supply potentials $V_{DD}$ and $V_{SS}$ can be supplied to an internal voltage generator circuit 170. The internal voltage generator circuit 170 can generate various internal potentials $V_{PP}$, $V_{OD}$, $V_{ARY}$, $V_{PERI}$, and the like based on the power supply potentials $V_{DD}$ and $V_{SS}$. The internal potential $V_{PP}$ can be used in a row decoder 140, the internal potentials $V_{OD}$ and $V_{ARY}$ can be used in sense amplifiers included in a memory array 150 of the memory device 100, and the internal potential $V_{PERI}$ can be used in many other circuit blocks.

The power supply terminals may also be supplied with power supply potential VDDQ. The power supply potential $V_{DDQ}$ can be supplied to an input/output (I/O) circuit 160 together with the power supply potential $V_{SS}$. The power supply potential $V_{DDQ}$ can be the same potential as the power supply potential $V_{DD}$ in an embodiment of the present technology. The power supply potential $V_{DDQ}$ can be a different potential from the power supply potential $V_{DD}$ in another embodiment of the present technology. However, the dedicated power supply potential $V_{DDQ}$ can be used for the I/O circuit 160 so that power supply noise generated by the I/O circuit 160 does not propagate to the other circuit blocks.

The clock terminals, data clock terminals, and/or the additional clock terminal(s) may be supplied with external clock signals and/or complementary external clock signals. The external clock signals CK, CKF, WCK, and/or WCKF can be supplied to a clock input circuit 133. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

In embodiments in which the memory device 100 includes both clock terminals and data clock terminals, the clock signals CK and CKF received at the clock terminals can have the same or different frequencies as the data clock signals WCK and WCKF received at the data clock terminals. For example, the data clock signals WCK and WCKF can have a frequency greater than (e.g., two times as great, four times as great, etc.) the frequency of the clock signals CK and CKF, respectively, depending on an operating mode of the memory device 100. More specifically, the data clock signals WCK and WCKF (a) can have a frequency twice as great as the frequency of the clock signals CK and CKF, respectively, when the memory device 100 is operating in a low-power operation mode, and (b) can have a frequency four times as great as the frequency of the clocks signals CK and CKF, respectively, when the memory device 100 is operating in a high-speed or high data transfer operation mode. In these and other embodiments, data strobe signals output via the read data strobe terminal RDQS can be generated using or based at least in part on the data clock signals WCK and WCKF. In embodiments in which the memory device 100 does not include the data clock terminals, the data strobe signals output and/or received via the DQS terminals can be generated using or based at least in part on the clock signals CK and CKF.

Input buffers included in the clock input circuit 133 can receive the external clock signals. For example, when enabled by a CKE signal from a command decoder 115, an input buffer can receive the CK and CKF signals and/or the WCK and WCKF signals. The clock input circuit 133 can receive the external clock signals to generate internal clock signals ICLK. The internal clock signals ICLK can be supplied to an internal clock circuit 130. The internal clock circuit 130 can provide various phase and frequency controlled internal clock signals based on the received internal clock signals ICLK and a clock enable signal CKE from the command decoder 115. For example, the internal clock circuit 130 can include a clock path (not shown in FIG. 1B) that receives the internal clock signal ICLK and provides various clock signals (not shown) to the command decoder 115. The internal clock circuit 130 can further provide input/output (I/O) clock signals. The I/O clock signals can be supplied to the I/O circuit 160 and can be used as timing signals to, for example, determine an output timing and/or an input timing of data transmitted over the DQ bus 119

(FIG. 1A) and/or conditions/commands transmitted over the command insertion signal trace(s) 120 (FIG. 1A) via the command insertion terminal(s) CI. The I/O clock signals can be provided at multiple clock frequencies so that data can be output from and input into the memory device 100 at different data rates. A higher clock frequency may be desirable when high memory speed is desired. A lower clock frequency may be desirable when lower power consumption and/or looser timing margins are desired. The internal clock signals ICLK can also be supplied to a timing generator 135 and thus various internal clock signals can be generated that can be used by the command decoder 115, the column decoder 145, the I/O circuit 160, and/or other components of the memory device 100.

The memory device 100 may include an array of memory cells, such as memory array 150. The memory cells of the memory array 150 may be arranged in a plurality of memory regions, and each memory region may include a plurality of word lines (WL), a plurality of bit lines (BL), and a plurality of memory cells arranged at intersections of the word lines and the bit lines. In some embodiments, a memory region can be one or more memory banks or another arrangement of memory cells (e.g., half memory banks, subarrays in a memory bank, etc.). In these and other embodiments, the memory regions of the memory array 150 can be arranged in one or more groups (e.g., one or more groups of memory banks). Memory cells in the memory array 150 can include any one of a number of different memory media types, including capacitive, magnetoresistive, ferroelectric, phase change, or the like. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least one respective main I/O line pair (MIOT/B), via transfer gates (TG), which can function as switches. The memory array 150 may also include plate lines and corresponding circuitry for managing their operation.

The command terminals and address terminals may be supplied with an address signal and a bank address signal from outside the memory device 100. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals can be supplied with command signals CMD, address signals ADDR, and chip selection signals CS (e.g., from the memory controller 101 and/or the host device 108). The command signals may represent various memory commands (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command (not shown) to the command decoder 115. The command decoder 115 may further include one or more registers 128 for tracking various counts or values, such as a number of times a memory region (e.g., a memory row) has been activated.

When a read command is issued, and a row address and a column address are timely supplied with the read command, read data can be read from memory cells in the memory array 150 designated by the row address and column address. The read command may be received by the command decoder 115, which can provide internal commands to the I/O circuit 160 so that read data can be output from the data terminals DQ, DBI, and DMI via read/write (RW) amplifiers 155 and the I/O circuit 160 according to the read data strobe timing signals output from the memory device 100 via the DQS or RDQS terminals. As a specific example, the memory device 100 can transmit (a) read data strobe timing signal to the memory controller 101 (FIG. 1A) and (b) read data to the memory controller 101 via the DQ terminals of the memory device 100. The read data strobe timing signals can be used as a clock to strobe the read data into the memory controller 101. In other words, the read data strobe timing signals can be used to instruct the memory controller 101 when to sample the read data it receives from the memory device 100.

In some embodiments, the read data may be provided at a time defined by read latency information RL that can be programmed in the memory device 100, for example, in a mode register (not shown in FIG. 1B). The read latency information RL can be defined in terms of clock cycles of the CK clock signal. For example, the read latency information RL can be a number of clock cycles of the CK signal after the read command is received by the memory device 100 when the associated read data is provided.

When a write command is issued, and a row address and a column address are timely supplied with the command, write data can be supplied to the data terminals DQ, DBI, and DMI according to the DQS, WCK, and/or WCKF clock signals. The write command may be received by the command decoder 115, which can provide internal commands to the I/O circuit 160 so that the write data can be received by data receivers in the I/O circuit 160, and supplied via the I/O circuit 160 and the RW amplifiers 155 to the memory array 150. The write data may be written in the memory cell designated by the row address and the column address. In some embodiments, the write data may be provided to the data terminals at a time that is defined by write latency WL information. The write latency WL information can be programmed in the memory device 100, for example, in the mode register (not shown in FIG. 1B). The write latency WL information can be defined in terms of clock cycles of the CK clock signal. For example, the write latency information WL can be a number of clock cycles of the CK signal after the write command is received by the memory device 100 when the associated write data is received.

As a specific example of a write operation, the memory controller 101 (FIG. 1A) can supply (a) an external DQS signal (e.g., a differential write data strobe (WDQS) signal comprising DQS_t and DQS_c) to the DQS terminals of the memory device 100 and (b) write data to the DQ terminals of the memory device 100. The external DQS signal can be used as a clock to strobe the write data into the memory device 100 via the DQ terminals. In other words, the external DQS signal can be used to instruct the memory device 100 when to sample the write data received at the DQ terminals of the memory device 100. In some embodiments, when the memory controller 101 (FIG. 1A) initiates a write operation, the memory controller 101 can begin toggling the external DQS signal during a write preamble period to notify the memory device 100 that the memory controller 101 will soon begin transmitting write data to the DQ terminals of the memory device 100. After the preamble period, the memory controller 101 can supply write data to the DQ terminals of the memory device 100 in accordance with the external DQS signal. In turn, the memory device 100 can latch and register the write data received at the DQ terminals at rising and/or falling edges of an internal DQS signal that is generated based at least in part on the external DQS signal.

At the end of the data transmission (e.g., after a burst of eight data bits), the memory controller 101 can stop transmitting the external DQS signal. More specifically, the memory controller 101 (a) can hold the external DQS signal low for half (or another fraction or multiple) of its period (tCK) of the external DQS signal during a write postamble period in accordance with a DQS write postamble specification tWPST and (b) can then stop driving the external DQS signal. During the write postamble period, the memory device 100 can finish latching and registering the write data received at the DQ terminals. After the memory controller 101 stops driving the external DQS signal, the last rising edge of the external DQS signal can be floated or pulled to a termination voltage.

Figure 2A:
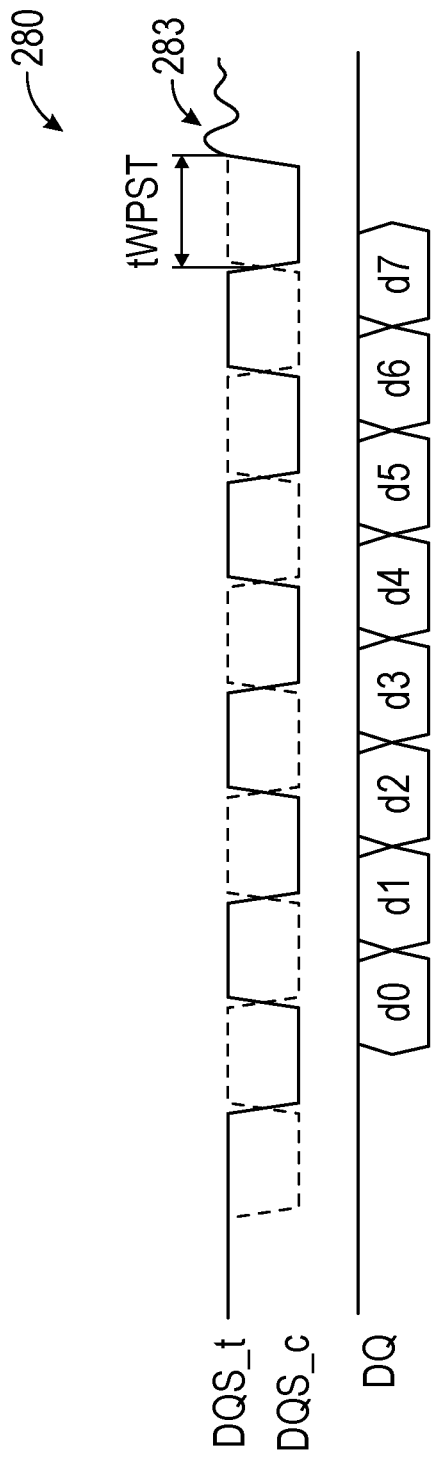
FIG. 2A is a signal diagram of complementary external DQS signals and an external data (DQ) signal.
Figure 2B:
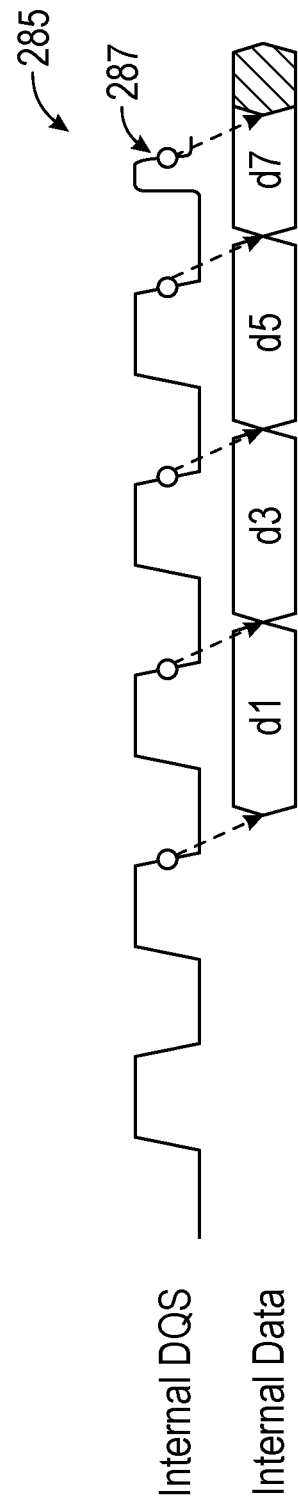
FIG. 2B is a signal diagram of an internal DQS signal and an internal DQ signal.

As discussed above, reflections (e.g., due to parasitics) on the DQS bus 119 (FIG. 1A) can cause ringing in the external DQS signal. When the ringing causes the external DQS signal to exceed a midpoint or another value of a reference voltage and then drop below the midpoint or the other value, the memory device 100 can interpret and register the ringing as a transition in the external DQS signal. For example, FIG. 2A is a signal diagram 280 of complementary external DQS signals DQS_t and DQS_c and of a corresponding external DQ signal, and FIG. 2B is a signal diagram 285 of an internal DQS signal and an internal DQ signal. The internal DQS signal of FIG. 2B is generated based at least in part on the complementary external DQS signals DQS_t and DQS_c of FIG. 2A (e.g., without use of DQS pulse control circuitry of the present technology that is described in greater detail below). Referring to FIGS. 2A and 2B together, the memory controller 101 (FIG. 1A) transmits a burst of eight bits d0-d7 of write data in accordance with transitions of the complementary external DQS signals DQS_t and DQS_c (FIG. 2A). In turn, the memory device 100 (FIGS. 1A and 1B) latches and registers the eight bits d0-d7 of write data on a corresponding rising edge and/or falling edge of the internal DQS signal (FIG. 2B). At the end of the eight bit burst, the memory controller 101 holds the external DQS signal DQS_t low (and/or the external DQS signal DQS_c high) for a length of time during a write postamble period (in accordance with the write postamble specification tWPST). Afterwards, the memory controller 101 stops driving the complementary external DQS signals DQS_t and DQS_c, and the external DQS_t signal is floated and/or pulled up toward a termination voltage.

At this point, reflections on the DQS bus 119 (FIG. 1A) can cause ringing 283 (FIG. 2A) on one or both of the external DQS signals DQS_t and/or DQS_c, which the memory device 100 can interpret as a transition of the external DQS signal(s) DQS_t and/or DQS_c (e.g., from a low state to a high state and then from the high state to the low state, and/or vice versa). As shown in FIG. 2B, the ringing can cause the memory device 100 to register a glitch pulse 287 in the internal DQS signal. In response, the memory device 100 can attempt to latch incorrect or invalid data at the DQ terminals (e.g., at the rising and/or falling edge of the glitch pulse 287), thereby corrupting the last bit d7 of write data latched by the memory device (e.g., by an amount corresponding at least in part to the width of the glitch pulse 287 in the internal DQS signal). Additionally, or alternatively, because the width of the glitch pulse 287 is less than approximately 0.5 tCK, the memory device 100 may not have enough margin to correctly latch the corrupted data. As a result, the glitch pulse 287 can cause the write operation to fail. A write operation failure can also occur when (a) the memory controller 101 does not hold the external DQS signal DQS_t low during the write postamble period for approximately the length of time (e.g., 0.3 tCK or more, or about 200 ps or longer) defined by the DQS write postamble specification tWPST (e.g., 0.5 tCK, or about 330 ps), and (b) the memory device 100 registers a glitch pulse on the internal DQS signal.

To address these concerns, memory devices configured in accordance with the present technology (e.g., the memory device 100 of FIG. 1B) can include DQS pulse control circuitry 165 (FIG. 1B). In particular, an external DQS signal received by the memory device 100 at the DQS terminals can be fed into an input buffer 161 and/or into the DQS pulse control circuitry 165 of the I/O circuit 160. In turn, the DQS pulse control circuitry 165 can generate an internal DQS signal based at least in part on the external DQS signal. As discussed in greater detail below, the DQS pulse control circuitry 165 can extend or stretch any pulses in the external DQS signal that have widths shorter than a minimum pulse width such that the corresponding pulses in the internal DQS signal output from the DQS pulse control circuitry 165 have widths greater than or equal to the minimum pulse width. For example, internal DQS pulses that have pulse widths of approximately 0.3 tCK-0.7 tCK (e.g., 0.5 tCK) are not expected to corrupt internally latched data or cause write operation failures because these internal DQS pulses have similar timing margins afforded by DQS pulses during normal write operations. Thus, the minimum pulse width can be set to a value between 0.3 tCK and 0.7 tCK (e.g., 0.5 tCK) in some embodiments. In these embodiments, the DQS pulse control circuitry 165 can stretch any pulses in an external DQS signal having widths less than the minimum pulse width such that the corresponding pulses in the internal DQS signal output from the DQS pulse control circuitry 165 each have widths equal to the minimum pulse width. Additionally, or alternatively, the DQS pulse control circuitry 165 can be configured such that widths of pulses in the external DQS signals that are greater than or equal to the minimum pulse width pass unhindered or unaltered through the DQS pulse control circuitry 165. In other words, the DQS pulse control circuitry 165 can ensure that all pulses in an internal DQS signal output from the DQS pulse control circuitry 165 have widths that are greater than or equal to a minimum pulse width, reducing the likelihood that valid data latched by the memory device 100 is corrupted and/or that write operations fail due to insufficient timing margins. Additionally, or alternatively, when a memory controller does not hold the external DQS signal low during the write postamble period for approximately the length of time defined by the DQS write postamble specification tWPST (e.g., when the memory controller holds the external DQS signal low for 0.3 tCK or less, or about 200 ps or less), the DQS pulse control circuitry can extend the length of time the corresponding portion of the internal DQS signal is held low (e.g., to the minimum pulse width, such as 0.5 tCK or about 330 ps).

Although shown as part of the I/O circuitry 160 in FIG. 1B, the DQS pulse control circuitry 165 can be positioned at other locations within the memory device 100 in other embodiments. For example, in embodiments in which the memory device 100 uses the data clock signals WCK and WCKF as write data strobe signals, the DQS pulse control circuitry 165 can be positioned within the clock input circuit 133, the timing generator 135, and/or the internal clock circuit 130 to control pulses registered on internal signals generated based at least in part on the data clock signals WCK and/or WCKF.

Figure 3:
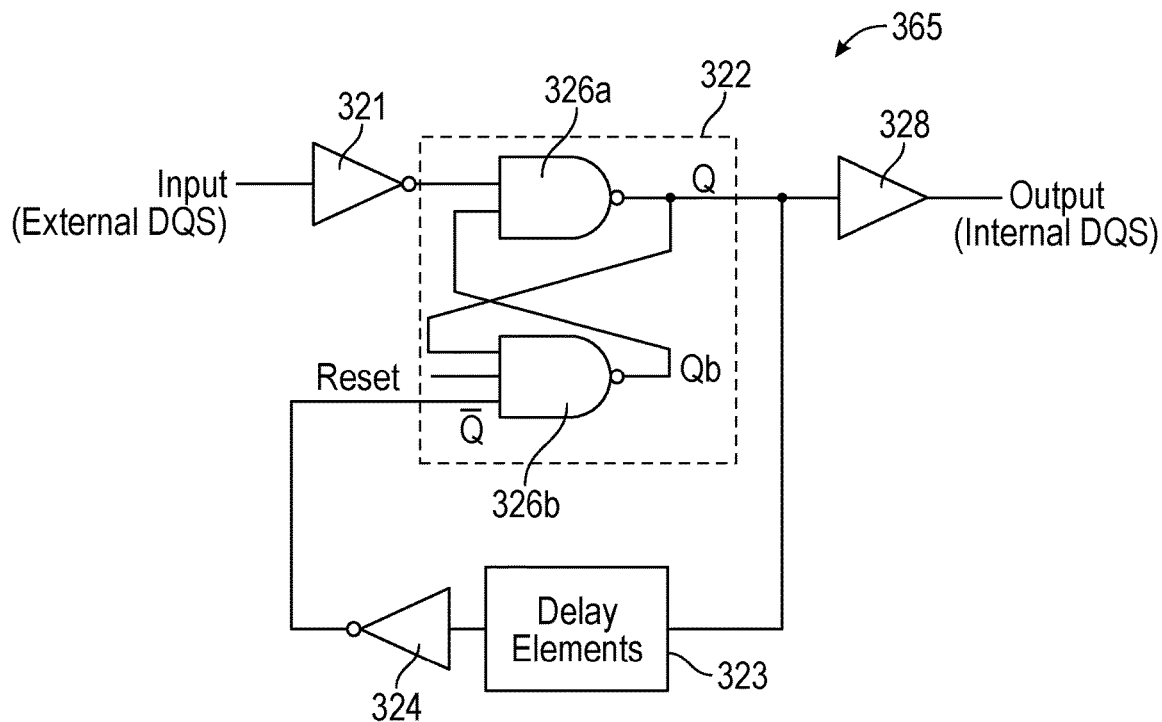
FIG. 3 is a schematic diagram of DQS pulse control circuitry configured in accordance with various embodiments of the present technology.

FIG. 3 is a schematic diagram of DQS pulse control circuitry 365 ("the circuitry 365") configured in accordance with various embodiments of the present technology. In some embodiments, the circuitry 365 can be the DQS pulse control circuitry 165 of FIG. 1B or other DQS pulse control circuitry of the present technology. As shown, the circuitry 365 includes a first inverter 321, a set/reset (SR) latch 322, delay elements 323, a second inverter 324, and an amplifier 328. The SR latch 322 includes two NAND logic gates 326 (identified individually in FIG. 3 as first NAND logic gate 326a and second NAND logic gate 326b). In other embodiments, the SR latch 322 can include other logic gates (e.g., NOR logic gates) and/or other circuit elements. Using an SR latch composed of logic gates can reduce or minimize (a) process, voltage, and temperature (PVT) variation and/or (b) power consumption. The delay elements 323 of the circuitry 365 can include inverters, logic gates, and/or other suitable metallization or circuit elements for delaying signals from reaching the second inverter 324 and/or an input of the second NAND logic gate 326b, as discussed in greater detail below.

The circuitry 365 is configured such that an input is provided to the first inverter 321. In some embodiments, the input can be an external DQS signal received, for example, from a memory controller at a DQS terminal of a corresponding memory device. In other embodiments, an external DQS signal received at a DQS terminal can be fed into an input buffer (not shown) electrically connected to the first inverter 321 such that the input of the circuitry 365 is an output of the input buffer that is based at least in part on the external DQS signal fed into the input buffer.

In turn, the first inverter 321 inverts the state of the input signal and feeds the inverted input signal into an input of the first NAND logic gate 326a of the SR latch 322. As discussed in greater detail below, a second input of the first NAND logic gate 326a is fed an output Qb of the second NAND logic gate 326b of the SR latch 322. The output Q of the first NAND logic gate 326a is (a) fed as an input into the second NAND logic gate 326b, (b) fed as an input into the delay elements 323 and (after a delay) into the second inverter 324, and (c) fed as an input into the amplifier 328 such that it is amplified and used as an output of the circuitry 365. The output of the circuitry 365 is also referred to herein as an internal DQS signal having internal DQS pulses corresponding to external DQS pulses on an external DQS signal fed into the circuit 365.

As discussed above, the delay elements 323 are configured to delay the output Q of the first NAND logic gate 326a from reaching the second inverter 324 and/or the second NAND logic gate 326b. In some embodiments, delay imposed (e.g., injected) by the delay elements 323 can be fixed (e.g., at a time of manufacturing) or reprogrammable (e.g., alterable). In these and other embodiments, the delay imposed by the delay elements 323 can be set to a value between 0.3 tCk and 0.7 tCk (e.g., 0.5 tCK), as discussed in greater detail below. Continuing with this example, when a portion of the output Q is provided to the delay elements 323, the delay elements can delay the portion of the output Q from reaching the second inverter 324 and/or the second NAND logic gate 326b by approximately 0.5 tCK. In turn, the second inverter 324 is configured to invert the output Q and feed the inverted output Q (hereinafter referred to as "signal Q-bar") as an input into the second NAND logic gate 326b of the SR latch 322. In some embodiments, the delay elements 323 can be electrically positioned between the second inverter 324 and the second NAND logic gate 326b such that the second inverter 324 inverts the output Q into the signal Q-bar and such that the signal Q-bar is delayed from reaching the second NAND logic gate 326b by the delay elements 323.

The second NAND logic gate 326b is further configured to receive a reset signal as an input. As discussed in greater detail below, the reset signal can be asserted upon powerup of the circuitry 365 and/or of the corresponding memory device. In these and other embodiments, the reset signal can remain unasserted after being asserted at powerup (e.g., until a next instance of powerup of the circuitry 365 and/or of the memory device).

Figure 4:
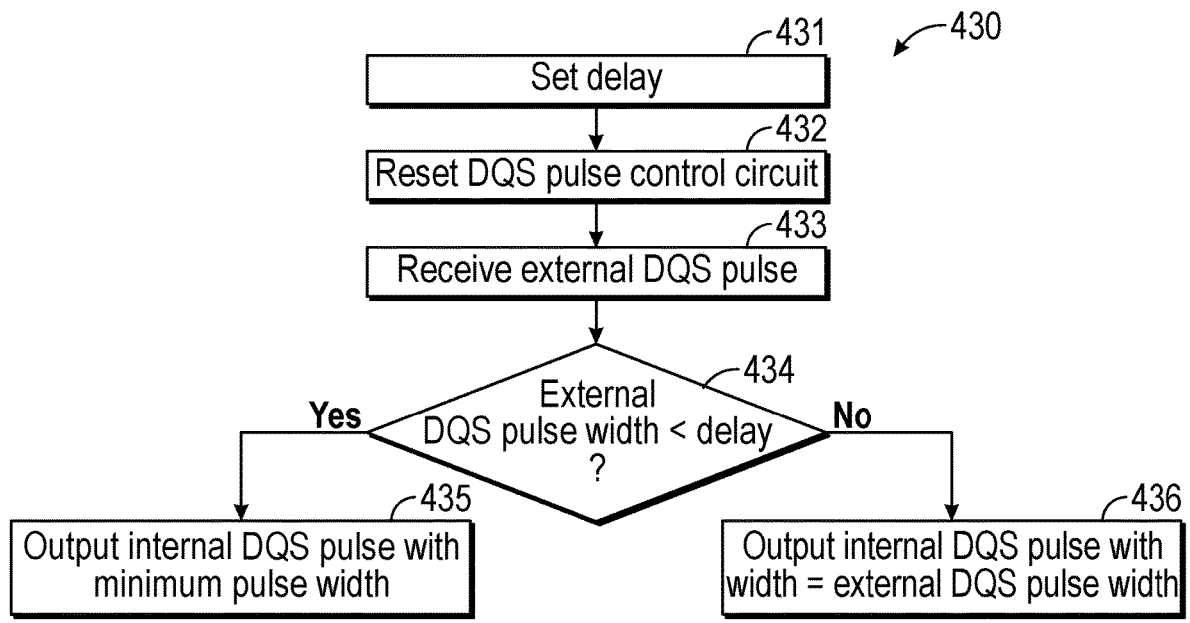
FIG. 4 is a flow diagram illustrating a method of operating the DQS pulse control circuitry of FIG. 3 in accordance with various embodiments of the present technology.
Figure 5A:
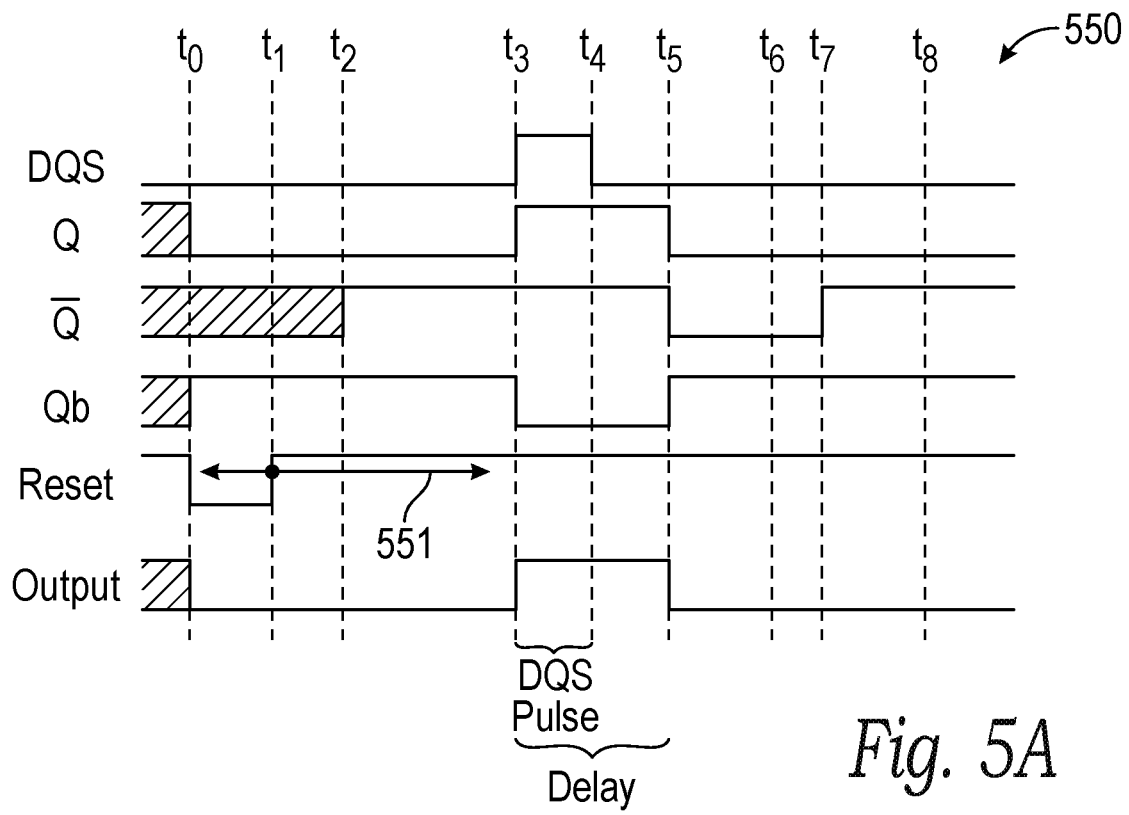
FIGS. 5A and 5B are signal diagrams of the DQS pulse control circuitry of FIG. 3 in accordance with various embodiments of the present technology.
Figure 5B:
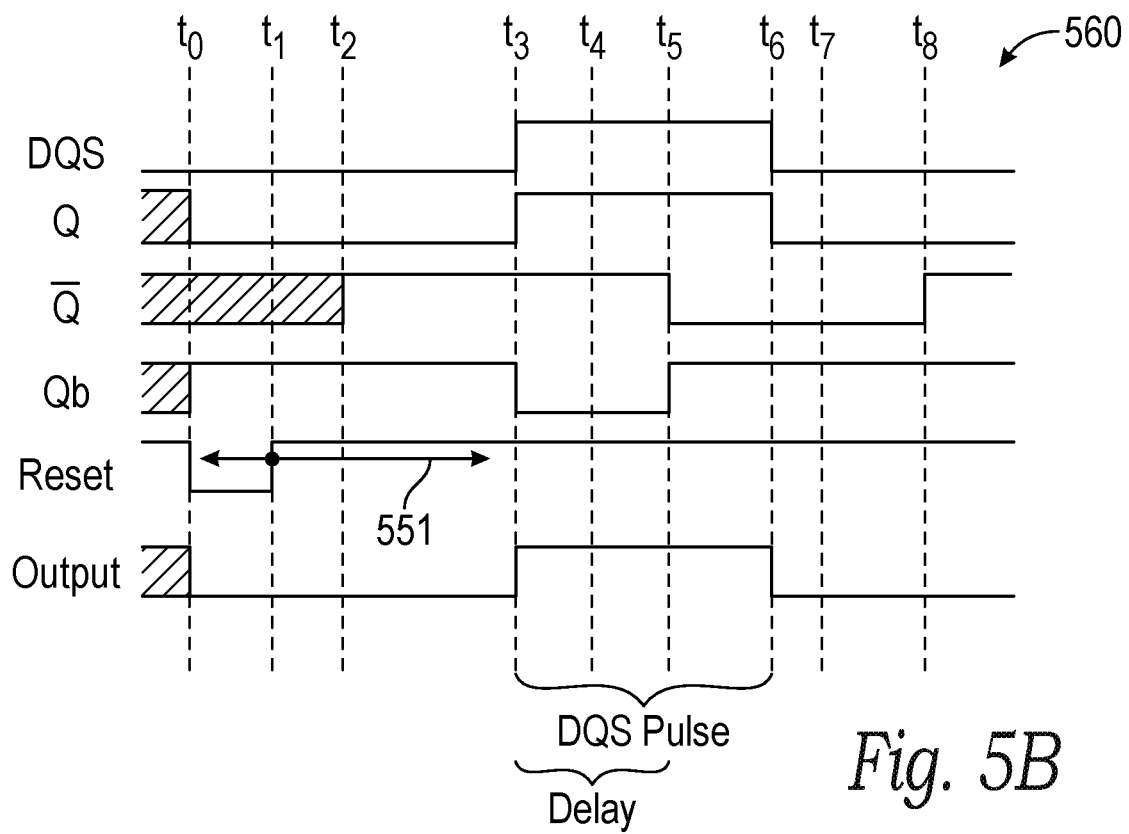

FIG. 4 is a flow diagram illustrating a method 430 of operating the DQS pulse control circuitry 365 of FIG. 3 in accordance with various embodiments of the present technology. The method 430 is illustrated as a set of steps or blocks 431-436. All or a subset of one or more of the blocks 431-436 can be executed by components or devices of a memory system, such as the memory system 190 of FIG. 1A. For example, all or a subset of one or more of the blocks 431-436 can be executed by (i) a memory device (e.g., a memory device 100 of FIGS. 1A and 1B), (ii) a memory controller (e.g., the memory controller 101 of FIG. 1A), and/or (iii) a host device (e.g., the host device 108 of FIG. 1A). The method 430 is discussed in detail below with repeated reference to FIGS. 3, 5A, and 5B for the sake of clarity and understanding. FIGS. 5A and 5B are signal diagrams 550 and 560, respectively, of the DQS pulse control circuitry of FIG. 3 in accordance with various embodiments of the present technology.

The method 430 begins at block 431 by setting a delay imposed by the delay elements 323 (FIG. 3) of the circuitry 365 (FIG. 3). As discussed above, the delay can be set at a time of manufacturing. For example, the delay elements 323 can include inverters, logic gates, and/or other suitable metallization or circuit elements that impose a fixed amount of delay. Continuing with this example, the delay imposed by the delay elements 323 can be fixed at a time of assembling the circuitry 365 by including specific elements having a fixed delay in the delay elements 323 of the circuitry 365. In other embodiments, the delay imposed by the delay elements 323 can be programmable or reprogrammable. For example, elements of the delay elements 323 can adjusted (e.g., activated, deactivated, and/or altered), such as with a fuse array (not shown) of the corresponding memory device, such that the delay imposed by the delay elements 323 of the circuitry 365 can be adjusted. As discussed in greater detail below, the delay imposed by the delay elements 323 can correspond to a minimum pulse width output by the circuitry 365. In some embodiments, the delay can be set to a value between 0.3 tCk and 0.7 tCk (e.g., 0.5 tCK). In some embodiments, a delay significantly less than 0.5 tCK can induce write operation failures in the corresponding memory device for lack of sufficient timing margins to latch write data. In these and other embodiments, a delay significantly greater than 0.5 tCK can also induce write operation failures by interfering with timing margins of a next latching of the write data at the next transition of the DQS signal.

At block 432, the method 430 continues by asserting the reset signal input into the second NAND logic gate 326b (FIG. 3) of the SR latch 322 (FIG. 3) of the circuitry 365. In some embodiments, the reset signal can be asserted upon powerup of the circuitry 365 and/or the corresponding memory device. In these and other embodiments, the reset signal can be asserted by transitioning the reset signal (a) from a high state to a low state or (b) from a low state to a high state. Referring to FIGS. 5A and 5B, the reset signal is asserted by temporarily transitioning the reset signal from a high state to a low state at time $t_0$. Asserting the reset signal forces the output Qb of the second NAND logic gate 326b to a high state regardless of its state before time $t_0$. In turn, assuming that the DQS signal is not at a high state (e.g., is not being driven and/or is currently at a low state), the output Q of the first NAND logic gate 326a is forced to a low state regardless of its state before time $t_0$. Thus, the output of the circuitry 365 (e.g., the internal DQS signal) is similarly forced to a low state regardless of its state before time $t_0$. The reset signal is then unasserted at time $t_1$. As shown by arrows 551 in FIGS. 5A and 5B, the width of the reset signal pulse can be longer or shorter than illustrated in FIGS. 5A and 5B. In some embodiments, the reset signal should be unasserted by time $t_3$.

At time $t_2$ in FIGS. 5A and 5B, the signal Q-bar is forced to a high state (e.g., the opposite state of the output Q at the time $t_0$) regardless of its state before time $t_2$. The time elapsed between the time $t_0$ and the time $t_2$ can correspond to the delay imposed by the delay elements 323 (FIG. 3) on the output Q before it reaches the second inverter 324 (FIG. 3) and/or the second NAND logic gate 326b (FIG. 3) of the circuitry 365. Therefore, by time $t_2$, the circuitry 365 has reached a reset state in which (a) the output Q and the output of the circuitry 365 are in a low state and (b) the signal Q-bar, the output Qb, and/or the reset signal are in a high state.

At block 433 of the method 430 (FIG. 4), the method 430 continues by receiving a pulse of an external DQS signal. In some embodiments, the external DQS signal can include the DQS signal DQS_t and/or the DQS signal DQS_c of FIG. 2A. For the sake of clarity and understanding of FIGS. 3-5B, a DQS pulse hereinafter refers to a temporary transition of the DQS signal from a low state to a high state. A DQS pulse, however, can additionally or alternatively refer to a temporary transition of the DQS signal from a high state to a low state in other embodiments of the present technology.

Referring again to FIGS. 5A and 5B, the circuitry 365 (FIG. 3) receives a DQS pulse at time $t_3$ when the DQS signal transitions from a low state to a high state. As the DQS signal transitions to the high state, the output Q of the first NAND logic gate 326a (FIG. 3) of the SR latch 322 (FIG. 3) is transitioned to a high state. In turn, the output Qb of the second NAND logic gate 326b (FIG. 3) of the SR latch 322 is transitioned to a low state.

At block 434 of the method 430 (FIG. 4), the method 430 continues by determining whether the width of the DQS pulse received at block 433 is less than the delay imposed by the delay elements 323 (FIG. 3) of the circuitry 365. If the width of the DQS pulse is less than the delay imposed by the delay elements 323, the method 430 proceeds to block 435 to output an internal DQS pulse corresponding to the DQS pulse received at block 433 but having a width equivalent to the minimum pulse width. The signal diagram 550 of FIG. 5A corresponds to a scenario in which the DQS pulse received at block 433 of the method 430 is less than the delay imposed by the delay elements 323 (FIG. 3) of the circuitry 365. On the other hand, if the width of the DQS pulse received at block 433 is greater than or equal to the delay imposed by the delay elements 323, the method 430 proceeds to block 436 to output an internal DQS pulse having a width equal to the width of the DQS pulse received at block 433. The signal diagram 560 of FIG. 5B corresponds to a scenario in which the DQS pulse received at block 433 of the method 430 is greater than or equal to the delay imposed by the delay elements 323 of the circuitry 365.

Referring to FIG. 5A, the delay imposed by the delay elements 323 (FIG. 3) of the circuitry 365 is represented as the difference between time $t_3$ and time $t_5$. As shown, the DQS pulse received at time $t_3$ is terminated at time $t_4$, meaning that the DQS pulse has a width less than the delay imposed by the delay elements 323 of the circuitry 365. In this event, the output Q (and therefore the output of the circuitry 365) remains high even after the DQS signal transitions to a low state at $t_4$. In particular, the output Q remains high until the output Q passes through the delay elements 323, is inverted by the second inverter 324 (FIG. 3) of the circuitry, and reaches the second NAND logic gate 326b (FIG. 3) at time $t_5$. More specifically, the signal Q-bar is transitioned to a low state after the delay and then is used to transition the output Qb of the second NAND logic gate 326b to a high state. When the output Qb transitions to the high state, the output Q is transitioned to the low state. As such, the circuitry 365 outputs an internal DQS pulse on the internal DQS signal that has a width corresponding to the delay imposed by the delay elements 323, also referred to as the minimum pulse width. At time $t_7$ (corresponding to time $t_5$ plus the delay imposed by the delay elements 323), the signal Q-bar is transitioned to the high state and the circuitry 365 is returned to the reset state discussed above with respect to block 432. In some embodiments, the method 430 (FIG. 4) can return to block 433 and await receipt of a next external DQS pulse at block 433.

Referring to FIG. 5B, the delay imposed by the delay elements 323 (FIG. 3) of the circuitry 365 is represented as the difference between time $t_3$ and time $t_5$. As shown, the DQS pulse received at time $t_3$ is terminated at time $t_6$, meaning that the DQS pulse has a width greater than or equal to the delay imposed by the delay elements 323 of the circuitry 365. In this event, the output Q (and therefore the output of the circuitry 365) remains high even after the signal Q-bar transitions to the low state and the output Qb of the second NAND logic gate 326b (FIG. 3) transitions to the high state at time $t_5$. In particular, the output Q remains in the high state for as long as the DQS signal remains in the high state. As such, the circuitry 365 outputs an internal DQS pulse on the internal DQS signal that has a width corresponding to the width of the external DQS pulse on the DQS signal. At time $t_8$ (corresponding to time $t_6$ plus the delay imposed by the delay elements 323), the signal Q-bar is transitioned to the high state and the circuitry 365 is returned to the reset state discussed above with respect to block 432. In some embodiments, the method 430 (FIG. 4) can return to block 433 and await receipt of a next external DQS pulse at block 433.

Although the blocks 431-436 of the method 430 are discussed and illustrated in a particular order, the method 430 illustrated in FIG. 4 is not so limited. In other embodiments, the method 430 can be performed in a different order.

In these and other embodiments, any of the block 431-436 of the method 430 can be performed before, during, and/or after any of the other blocks 431-436 of the method 430. Moreover, a person of ordinary skill in the relevant art will recognize that the illustrated method 430 can be altered and still remain within these and other embodiments of the present technology. For example, one or more blocks 431-436 of the method 430 illustrated in FIG. 4 can be omitted and/or repeated in some embodiments.

Embodiments of the present technology including DQS pulse control circuitry can therefore provide several advantages, such as guaranteeing a minimum internal DQS pulse width. In turn, embodiments of the present technology can guarantee minimum timing margins for latching data and thereby reduce the likelihood of write operation failures.

FIG. 6 is a signal diagram 685 of an internal DQS signal and an internal DQ signal in accordance with various embodiments of the present technology. The signal diagram 685 illustrates several of the advantages offered by embodiments of the present technology. For example, similar to the internal DQS signal of FIG. 2B, the internal DQS signal of FIG. 6 is generated based at least in part on the complementary external DQS signal DQS_t and DQS_c of FIG. 2A. In contrast to the internal DQS signal of FIG. 2B, however, the internal DQS signal of FIG. 6 is generated using DQS pulse control circuitry of the present technology.

Comparing the signal diagram 685 of FIG. 6 to the signal diagram 285 of FIG. 2B, the width of a glitch pulse 687 in the internal DQS signal of FIG. 6 is larger than the width of the glitch pulse 287 in the internal DQS signal of FIG. 2B. As a result, a corresponding memory device is afforded a greater amount of time to latch the last bit d7 of write data. Thus, the DQS pulse control circuitry used to generate the internal DQS signal of FIG. 6 (a) reduces the likelihood that the last bit d7 of write data is corrupted by the glitch pulse 687 and/or by a memory controller not holding the corresponding external DQS signal in the low state for at least 0.5 tCK in accordance with the write postamble specification tWPST and/or (b) reduces the likelihood that a write operation failure occurs. In some embodiments, the width of the glitch pulse 687 can correspond to the minimum pulse width (e.g., 0.5 tCK) and/or can be consistent with the write postamble specification tWPST, as discussed above.

Figure 7:
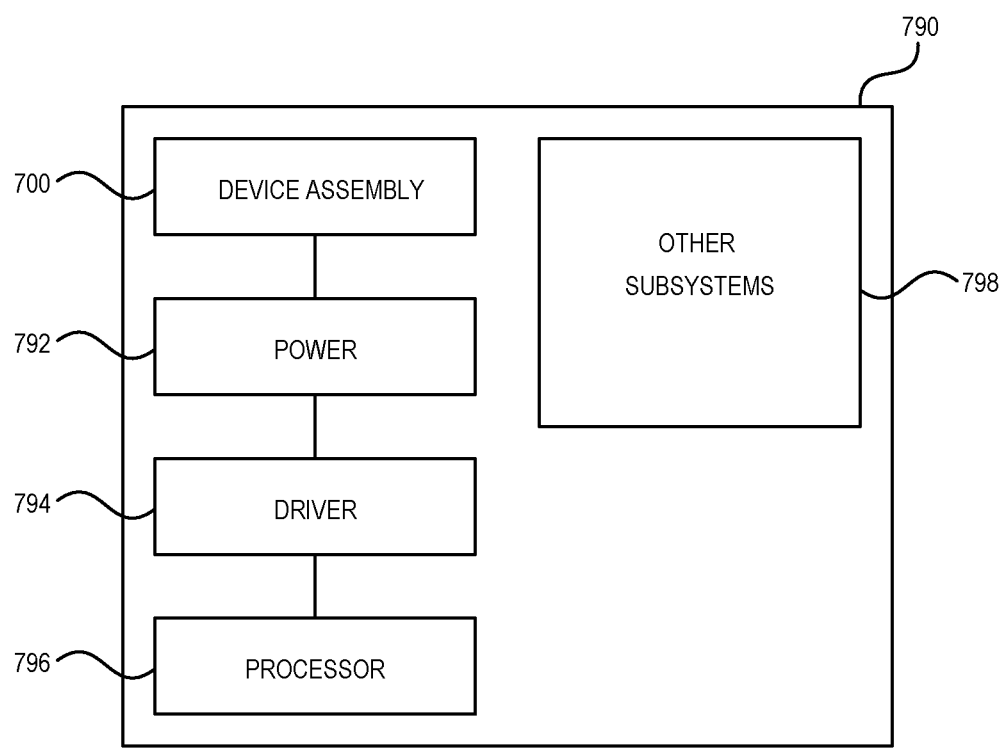
FIG. 7 is a schematic view of a system that includes a memory device or system configured in accordance with various embodiments of the present technology.

Any of the foregoing memory systems, devices, and/or methods described above with reference to FIGS. 1A-6 can be incorporated into any of a myriad of larger and/or more complex systems, a representative example of which is system 790 shown schematically in FIG. 7. The system 790 can include a semiconductor device assembly 700, a power source 792, a driver 794, a processor 796, and/or other subsystems and components 798. The semiconductor device assembly 700 can include features generally similar to those of the memory systems, devices, and/or methods described above with reference to FIGS. 1A-6. The resulting system 790 can perform any of a wide variety of functions, such as memory storage, data processing, and/or other suitable functions. Accordingly, representative systems 790 can include, without limitation, hand-held devices (e.g., mobile phones, tablets, digital readers, and digital audio players), computers, vehicles, appliances, and other products. Components of the system 790 may be housed in a single unit or distributed over multiple, interconnected units (e.g., through a communications network). The components of the system 790 can also include remote devices and any of a wide variety of computer readable media.

C. CONCLUSION

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps are presented and/or discussed in a given order, alternative embodiments can perform steps in a different order. Furthermore, the various embodiments described herein can also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms can also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Where the context permits, singular or plural terms can also include the plural or singular term, respectively. Furthermore, as used herein, the phrase "and/or" as in "A and/or B" refers to A alone, B alone, and both A and B. Additionally, the terms "comprising," "including," "having" and "with" are used throughout to mean including at least the recited feature(s) such that any greater number of the same feature and/or additional types of other features are not precluded.

From the foregoing, it will also be appreciated that various modifications can be made without deviating from the technology. For example, various components of the technology can be further divided into subcomponents, or that various components and functions of the technology can be combined and/or integrated. Furthermore, although advantages associated with certain embodiments of the technology have been described in the context of those embodiments, other embodiments can also exhibit such advantages, and not all embodiments need necessarily exhibit such advantages to fall within the scope of the technology. Accordingly, the disclosure and associated technology can encompass other embodiments not expressly shown or described herein.

What is claimed is:

1. A memory device, comprising:
    an external data strobe (DQS) terminal configured to receive an external DQS timing signal including (i) a first pulse having a first pulse width less than a minimum pulse width and (ii) a second pulse having a second pulse width greater than or equal to the minimum pulse width; and
    circuitry operably coupled to the external terminal to receive the external DQS timing signal, wherein the circuitry is configured to:
        generate a third pulse based at least in part on the first pulse, wherein the third pulse has a third pulse width equal to the minimum pulse width and greater than the first pulse width,
        generate a fourth pulse based at least in part on the second pulse, wherein the fourth pulse has a fourth pulse width equal to the second pulse width, and
        output an internal DQS timing signal including the third and fourth pulses.

2. The memory device of claim 1, wherein the circuitry includes delay elements, the minimum pulse width is based at least in part on a deploy imposed by the delay elements on a signal transmitted within the circuitry, and the third pulse width corresponds at least in part to the delay imposed by the delay elements.

3. The memory device of claim 1, wherein the minimum pulse width is equivalent to half of a period of the external DQS timing signal.

4. The memory device of claim 1, wherein the circuitry includes:
a set/reset (SR) latch; and
delay elements operably coupled to an output of the SR latch.

5. The memory device of claim 4, wherein the circuitry further includes:
a first inverter having an output operably coupled to a first input of the SR latch; and
a second inverter, wherein the second inverter is operably coupled to the delay elements, includes an input operably coupled to the output of the SR latch, and includes an output operably coupled to a second input of the SR latch.

6. The memory device of claim 5, wherein the SR latch further includes a third input operably coupled to a reset signal.

7. The memory device of claim 1, wherein the first pulse corresponds to ringing on the external timing signal.

8. The memory device of claim 1, further comprising an input buffer having an input operably coupled to the external terminal and an output operably coupled to an input of the circuitry.

9. The memory device of claim 1, further comprising a data (DQ) terminal configured to receive write data.

10. The memory device of claim 9, wherein the memory device is configured to sample the write data received at the DQ terminal based at least in part on timings defined by the internal DQS timing signal output from the circuitry.

11. A memory system, comprising:
a memory controller; and
a memory device operably connected to the memory controller, wherein the memory device includes:
an external data strobe (DQS) terminal configured to receive an external DQS timing signal from the memory controller, the external DQS timing signal including (i) a first pulse having a first pulse width and (ii) a second pulse having a second pulse width greater than the first pulse width; and
circuitry operably coupled to the external DQS terminal, wherein the circuitry is configured to:
generate a third pulse based at least in part on the first pulse, wherein the third pulse has a third pulse width greater than the first pulse width and equal to a minimum pulse width,
generate a fourth pulse based at least in part on the second pulse, wherein the fourth pulse has a fourth pulse width equal to the second pulse width and greater than or equal to the minimum pulse width, and
output an internal DQS timing signal including the third and fourth pulses.

12. The memory system of claim 11, wherein:
the memory device further includes a data (DQ) terminal configured to receive a DQ signal from the memory controller that includes write data; and
the memory device is configured to sample the write data received at the DQ terminal based at least in part on timings defined by the internal DQS timing signal output from the circuitry.

13. The memory system of claim 11, wherein:
the memory controller is configured to cease driving the external DQS timing signal to the external DQS terminal after a write postamble period at an end of a data transmission to the memory device; and
the first pulse corresponds to ringing on the external DQS timing signal after the memory controller ceases driving the external DQS timing signal.

14. A circuit, comprising:
an inverter having an input and an output, wherein the input is coupled to a data strobe (DQS) terminal of a memory device;
a set/reset (SR) latch having a first input coupled to the output of the inverter such that the SR latch receives an inverted DQS signal at the first input that corresponds to an external DQS signal received at the DQS terminal of the memory device; and
a delay element having (a) an input operably connected to an output of the SR latch and (b) an output operably connected to a second input of the SR latch, wherein a delay imposed by the delay element on signals output from the output of the SR latch corresponds to a minimum pulse width, and
wherein the circuit is configured to:
extend first pulses included in the external DQS signal that have pulse widths less than the minimum pulse width to corresponding second pulses having pulse widths equal to the minimum pulse width,
pass third pulses in the external DQS signal that have pulse widths greater than or equal to the minimum pulse width, and
output an internal DQS signal that includes the corresponding second pulses and the third pulses.

15. The circuit of claim 14, wherein the input of the inverter is coupled to the DQS terminal such that the inverter is configured to receive the external DQS signal at the input of the inverter.

16. The circuit of claim 14, further comprising another inverter having (a) an output operably connected to the second input of the SR latch or the input of the delay element, and (b) an input operably connected to the output of the SR latch or the output of the delay element.

17. The circuit of claim 14, wherein the delay element includes an inverter or a logic gate.

18. The circuit of claim 14, wherein the SR latch includes a NAND logic gate.

19. The circuit of claim 14, further comprising an amplifier having an input operably connected to the output of the SR latch and configured to output the internal DQS signal.

* * * * *